(12) United States Patent
Anegawa et al.

(10) Patent No.: US 8,264,279 B2
(45) Date of Patent: Sep. 11, 2012

(54) ELECTRONIC CIRCUIT

(75) Inventors: Osamu Anegawa, Kanagawa (JP);
Osamu Baba, Kanagawa (JP); Miki Kubota, Kanagawa (JP); Tsuneo Tokumitsu, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/013,291

(22) Filed: Jan. 25, 2011

(65) Prior Publication Data

US 2011/0181363 A1 Jul. 28, 2011

(30) Foreign Application Priority Data

Jan. 25, 2010 (JP) .................. 2010-012756

(51) Int. Cl.
*H03F 3/60* (2006.01)
*H03F 3/191* (2006.01)
(52) U.S. Cl. .................. 330/286; 330/302; 330/310
(58) Field of Classification Search .................. 330/286, 330/302, 306, 310
See application file for complete search history.

(56) References Cited

U.S. PATENT DOCUMENTS 4,528,518 A * 7/1985 Huber et al. .................. 330/277
6,320,468 B2 * 11/2001 Carroll et al. .................. 330/286

FOREIGN PATENT DOCUMENTS

| JP | 2-101613 A | 8/1990 |
| JP | 2-101613 U | 8/1990 |
| JP | 2-265309 A | 10/1990 |
| JP | 2004-349933 A | 12/2004 |

OTHER PUBLICATIONS

Tokumitsu T. et al. K- Band 3-D MMIC Low Noise Amplifier and Mixer Using TFMS Lines With Grounds Slit; 2000 IEEE Microwave and Wireless Components Letters, vol. 15, No. 5, May 2005; pp. 318-320, cited in spec.
Mimino Y. et al. "High Gain-Density K-Band P-HEMT LNA MMIC for LMDS and Satellite Communication"; 2000 IEEE MTT-S Dig., vol. 1, pp. 17-20, cited in spec.
Japanese Office Action dated May 8, 2012, issued in corresponding Japanese Patent application No. 2010-012756, with English Translation.

* cited by examiner

*Primary Examiner* — Steven J Mottola
(74) *Attorney, Agent, or Firm* — Westerman, Hattori, Daniels & Adrian, LLP

(57) ABSTRACT

An electronic circuit includes a first transistor having a first terminal grounded, a second transistor having a control terminal coupled with a second terminal of the first transistor, a first terminal grounded via a first capacitor, and a second terminal to which a DC power supply is connected, a first distributed constant line having one end connected to a first node between the second terminal of the first transistor and the control terminal of the second transistor and another end grounded via a second capacitor, a second distributed constant line having one end connected to the second terminal of the first transistor and another end connected to the first node, a third distributed constant line having one end connected to the control terminal of the second transistor and another end connected to the first node, a resistor connected between a second node between the first line and the second capacitor and a third node between the first terminal of the second transistor and the first capacitor, and a path that connects the third node and the second terminal of the first transistor via the first line and the resistor in a DC circuit operation.

10 Claims, 15 Drawing Sheets

FREQUENCY 45GHz~80GHz m5:
FREQUENCY = 63GHZ
Z2=Z0 × (0.246+j0.373)

m8:
FREQUENCY = 63GHZ
Z1=Z0 × (0.172−j0.381)

FREQUENCY 45GHz~80GHz m3:
FREQUENCY = 77GHZ
Z2=Z0 × (0.139+j0.316)

m4:
FREQUENCY = 50GHZ
Z2=Z0 × (0.201+j0.275)

m1:
FREQUENCY = 77GHZ
Z1=Z0 × (0.179-j0.279)

m2:
FREQUENCY = 50GHZ
Z1=Z0 × (0.148-j0.529)

FREQUENCY 45GHz～80GHz m3:
FREQUENCY = 77GHZ
Z2=Z0 × (0.246+j0.281)
m1:
FREQUENCY = 77GHZ
Z1=Z0 × (0.179−j0.279)

m4:
FREQUENCY = 50GHZ
Z2=Z0 × (0.648+j0.696)
m2:
FREQUENCY = 50GHZ
Z1=Z0 × (0.148−j0.529)

ELECTRONIC CIRCUIT

CROSS-REFERENCE TO RELATED APPLICATION

This application is based upon and claims the benefit of priority of the prior Japanese Patent Application No. 2010-012756, filed on Jan. 25, 2010, the entire contents of which are incorporated herein by reference.

BACKGROUND (i) Technical Field

The present invention relates to electronic circuits, and for example, to a current reuse amplifier circuit.

(ii) Related Art

In amplifier circuits having multiple stages, there is known a current reuse amplifier circuit in which a DC (direct current) current of a stage is used as a DC current of a previous stage (see 2000 IEEE MTT-S Dig., Vol. 1, pp. 17-20: this document is referred to as Document 1). There is known another current reuse amplifier circuit in which a stub and a capacitor are provided in order to increase the bandwidth in the millimeter wave band (see IEEE MICROWAVE AND WIRELESS COMPONENTS LETTERS VOL. 15, NO. 5, 2005: Document 2).

The amplifier circuit described in Document 2 realizes a wider bandwidth than that of the amplifier circuit in Document 1. However, the amplifier circuit in Document 2 has a large size because the stub and capacitor are used.

SUMMARY OF THE INVENTION

According to an aspect of the present invention, there is provided an electronic circuit having a wider bandwidth and a reduced size.

According to another aspect of the present invention, there is provided an electronic circuit including: a first transistor having a first terminal, a second terminal and a control terminal, the first terminal being grounded; a second transistor having a control terminal coupled with the second terminal of the first transistor, a first terminal grounded via a first capacitor, and a second terminal to which a DC power supply is connected; a first distributed constant line having one end connected to a first node between the second terminal of the first transistor and the control terminal of the second transistor and another end grounded via a second capacitor; a second distributed constant line having one end connected to the second terminal of the first transistor and another end connected to the first node; a third distributed constant line having one end connected to the control terminal of the second transistor and another end connected to the first node; a resistor connected between a second node interposed between the first distributed constant line and the second capacitor and a third node interposed between the first terminal of the second transistor and the first capacitor; and a path that connects the third node and the second terminal of the first transistor via the first distributed constant line and the resistor in a DC circuit operation.

DETAILED DESCRIPTION

Figure 1:
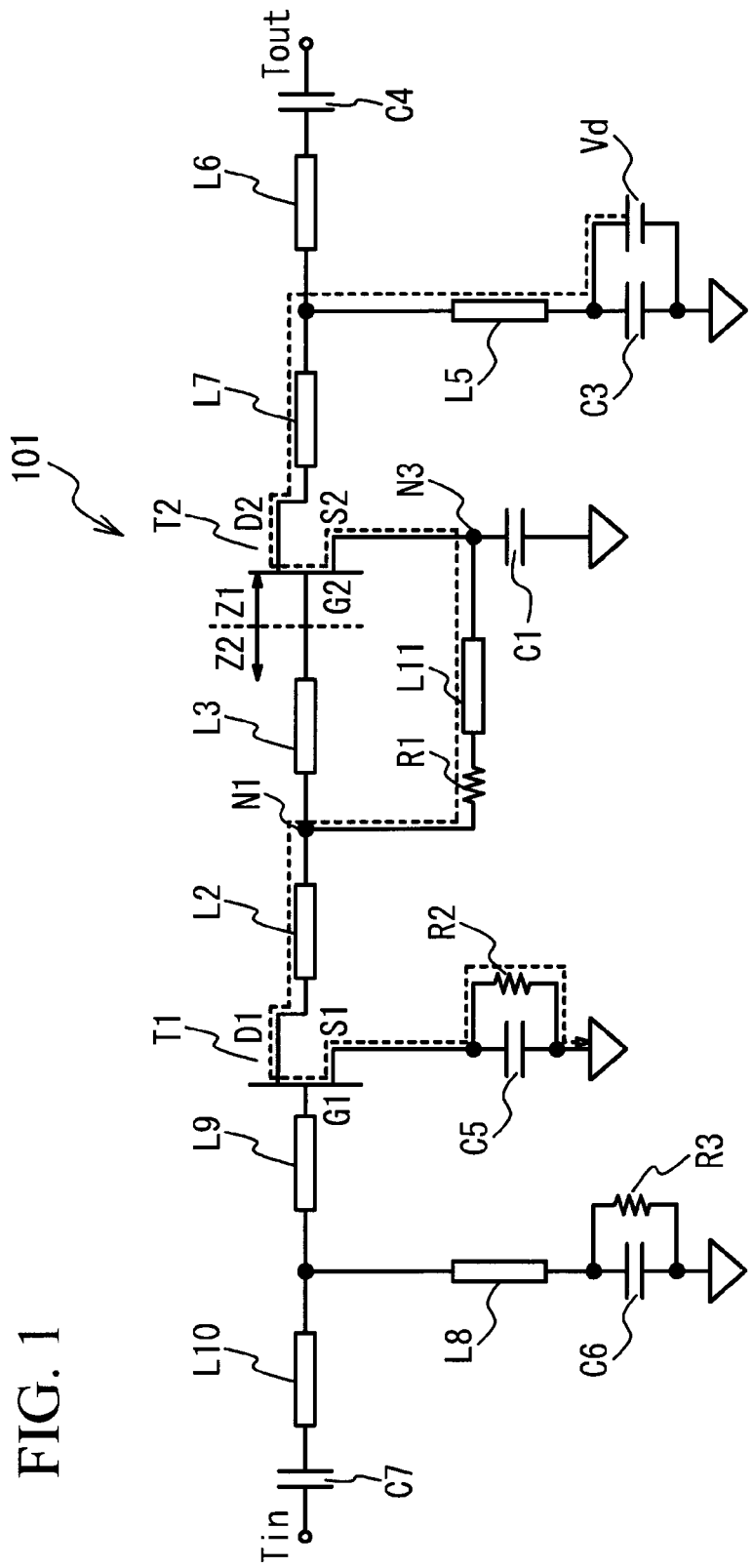
FIG. 1 is a circuit diagram of an amplifier circuit in accordance with a first comparative example.

First, a current reuse amplifier circuit is described by referring to a comparative example. FIG. 1 is a circuit diagram of an amplifier circuit in accordance with a first comparative example. Referring to FIG. 1, an amplifier circuit 101 is a two-stage amplifier circuit having a first transistor T1 and a second transistor T2. In the following, an exemplary configuration in which the first transistor T1 and the second transistor T2 are FETs (Field Effect Transistors) will be described.

A capacitor C7 and distributed constant lines L10 and L9 are connected in series between an input terminal Tin of the amplifier circuit 101 and a gate G1 (control terminal) of the first transistor T1. A node between the distributed constant lines L10 and L9 is grounded via a distributed constant line L8 and a capacitor C6. A resistor R3 is connected in parallel with the capacitor C6. A source S1 (first terminal) of the first transistor T1 is grounded via a capacitor C5 and a resistor R2. The capacitor C5 and the resistor R2 are connected in parallel. A drain D1 (second terminal) of the first transistor T1 is connected to a gate G2 (control terminal) of the second transistor T2 via second and third distributed constant lines L2 and L3 connected in series.

A source S2 (first terminal) of the second transistor T2 is grounded via a first capacitor C1. A first node N1 between the second distributed constant line L2 and the third distributed constant line L3 is connected to a third node N3 between the source S2 of the second transistor T2 and the first capacitor C1. Distributed constant lines L7 and L6 and a capacitor C4 are connected in series between a drain D2 (second terminal) of the second transistor T2 and an output terminal Tout. A node between the distributed constant lines L7 and L6 is grounded via a distributed constant line L5 and a capacitor C3. A power supply Vd is connected to the capacitor C3 in parallel. Thus, a DC power supply is connected to the drain D2, and a DC voltage is applied thereto.

The source S2 of the second transistor T2 is not grounded in DC circuit operations because of the presence of the first capacitor C1. Thus, a DC current from the power supply Vd flows through the distributed constant lines L5 and L7, the second transistor T2, the third node N3, a distributed constant line L11, the resistor R1, the first node N1, the second distributed constant line L2, the first transistor T1 and the resistor R2, as indicated by a broken-line arrow. Thus, the voltage of the power supply Vd is applied to the first transistor T1 and the second transistor T2 in series, and current supplied from the power supply Vd flows through the first transistor T1 and the second transistor T2. Thus, it is possible to reduce current consumed, as compared to an amplifier circuit in which currents flow through transistors independently. The resistor R1 has a function of developing a potential difference between the source S2 and the gate G2 of the second transistor T2.

Figure 2:
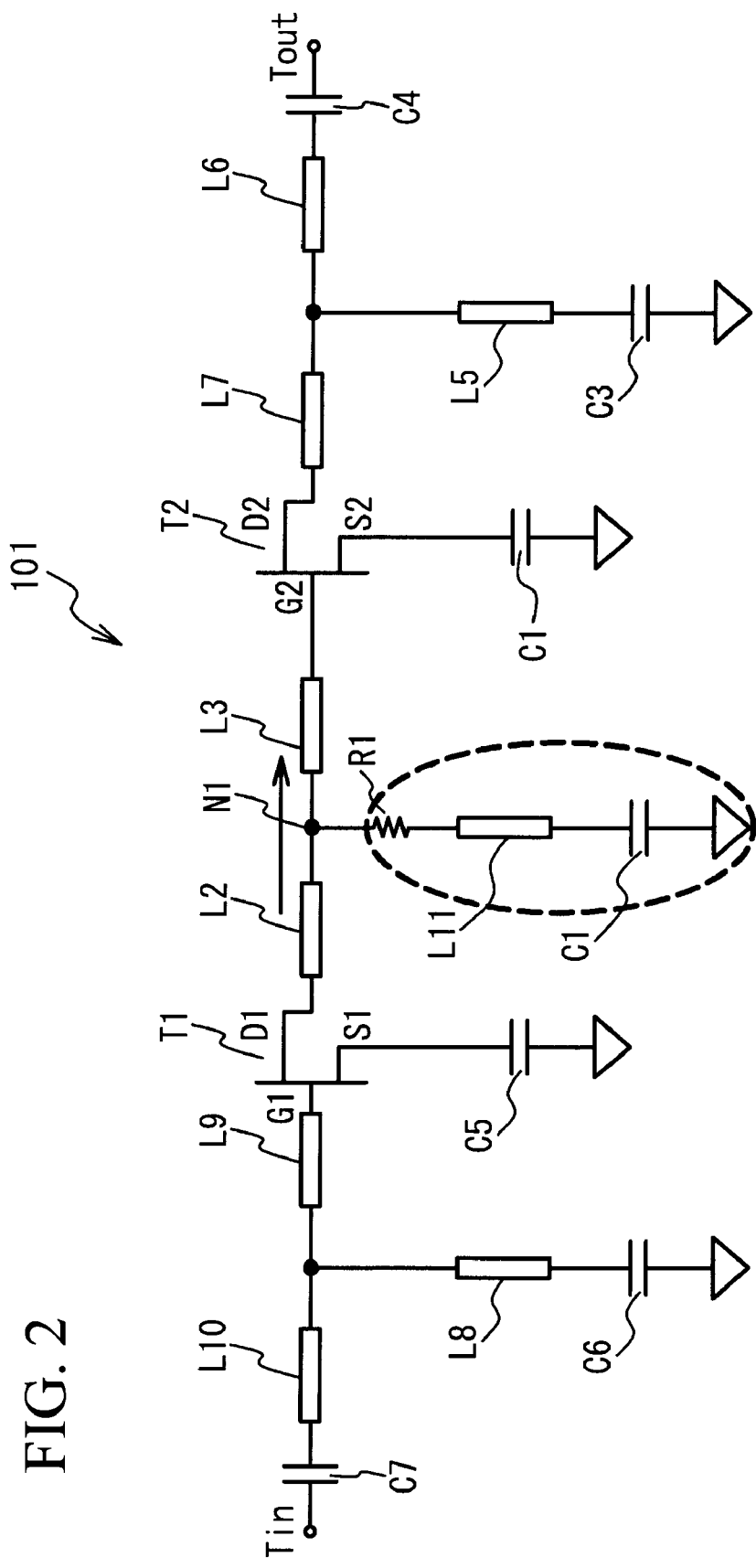
FIG. 2 is an equivalent circuit diagram of the amplifier circuit of the first comparative example in RF circuit operations.

FIG. 2 is an equivalent circuit of the amplifier circuit of the first comparative example in which the amplifier circuit is viewed in terms of RF (Radio Frequency) paths. An RF component from the first node N to the source S2 of the second transistor T2 illustrated in FIG. 1 is grounded via the capacitor C1. Thus, as illustrated in FIG. 2, in RF circuit operations, the first node N1 is grounded via the resistor R1, the distributed constant line L11 and the first capacitor C1 connected in series (see an ellipse of broken line). Here, the distributed constant line L11 and the first capacitor C1 are set so as to have high impedance in the band in which the amplifier circuit is used. For example, the length of the distributed constant line L11, which is a short stub, is set equal to $\lambda/4$ where $\lambda$ is the wavelength in the band used. Thus, the RF signal from the drain D1 of the first transistor T1 to the gate G2 of the second transistor T2 (an arrow from the second distributed constant line L2 to the third distributed constant line L3) does not see the resistor R1 connected to the first node N1 and the other elements in the ellipse in FIG. 2. As described above, the amplifier circuit 101 of the first comparative example is configured to reuse the DC current via the path of the resistor R1 and the distributed constant line L11 and to prevent the path from substantially affecting the RF circuit operations.

A description is now given of a computer simulation of the amplifier circuit 101 of the first comparative example. Table 1 shows parameter values used in the simulation.

TABLE 1

| Line | L11 | L2 | L3 | L5 | L6 | L7 | L8 | L9 | L10 |
|---|---|---|---|---|---|---|---|---|---|
| μm | 580 | 190 | 190 | 185 | 155 | 185 | 130 | 70 | 100 |
| Capacitor | | C1 | C3 | C4 | C5 | C6 | C7 | | |
| pF | | 1.5 | 2.8 | 1.1 | 1.5 | 2.0 | 2.3 | | |
| Resistor | | | R1 | | R2 | | R3 | | |
| Ω | | | 25 | | 25 | | 50 | | |
| Power supply | | | | | Vd | | | | |
| V | | | | | 5.0 | | | | |

In Table 1, the distributed constant lines L11, L2, L3 and L5 through L10 have a width of 10 μm, an effective dielectric constant of 1.5, and a characteristic impedance of 50Ω, and have respective lengths (μm) shown in Table 1. The unit of the capacitors C1 and C3 through C8 is pF. The unit of the resistors R1 through R3 is Ω. The unit of the power supply is V. The first transistor T1 and the second transistor T2 are GaAs/AlGaAs HEMTs (High Electron Mobility Transistors). Simulations of embodiments that will be described later employ units and transistors similar to the above.

Figure 3:
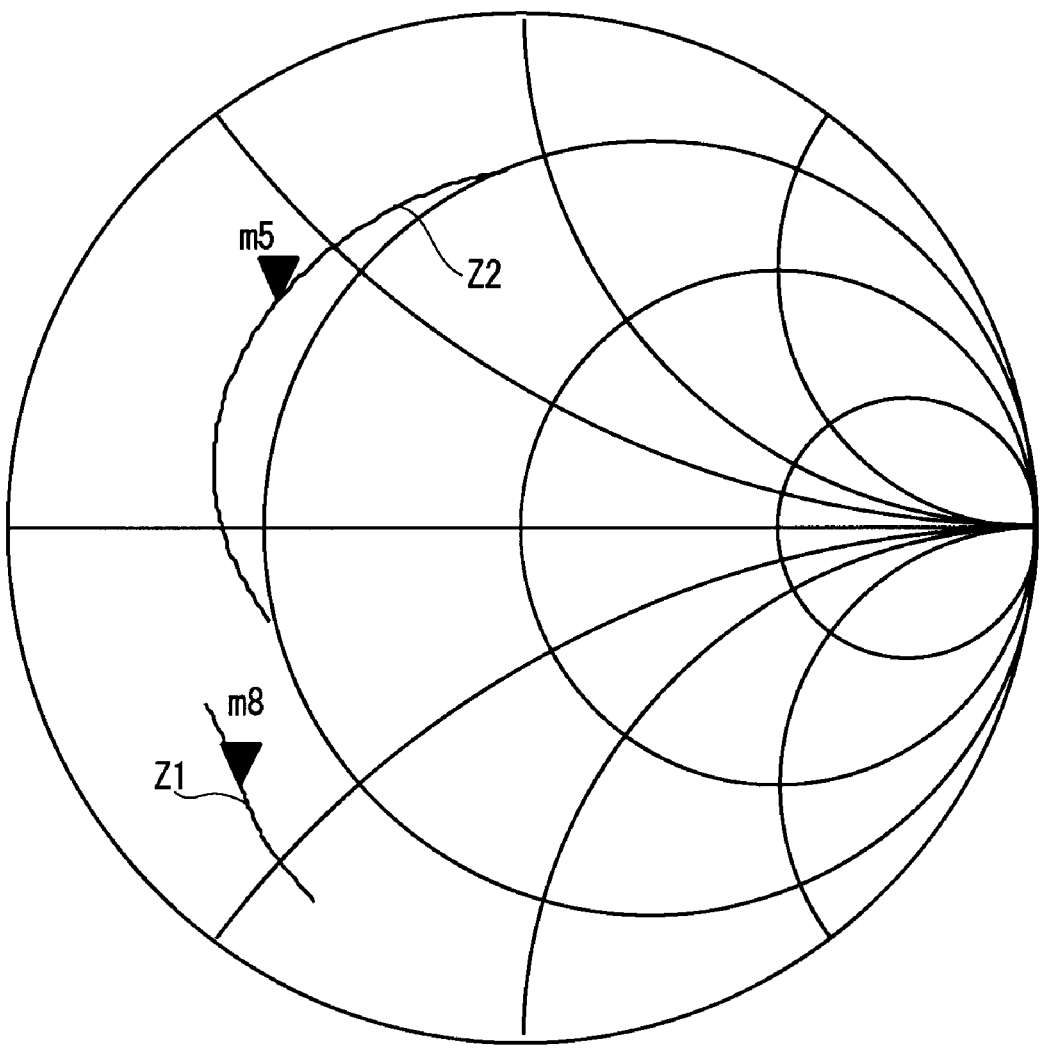
FIG. 3 is a Smith chart of a simulation of impedances Z1 and Z2.

FIG. 3 is a Smith chart in which a first impedance Z1 and a second impedance Z2 in FIG. 1 are simulated. The first impedance Z1 is an impedance obtained by viewing the second transistor T2 from the gate G2 thereof. The second impedance Z2 is an impedance obtained by viewing the third distributed constant line L3 from the gate G2 of the second transistor T2. The frequency used in the simulation ranges from 45 GHz to 80 GHz. In FIG. 3, inverted triangles m5 and m8 indicate the second impedance Z2 and the first impedance Z1 obtained at a frequency of 63 GHz, respectively. The first impedance Z1 and the second impedance Z2 are approximately complex conjugates at a frequency of about 60 GHz. That is, impedance matching is established at a frequency of about 60 GHz, and is not established at other frequencies.

Figure 4:
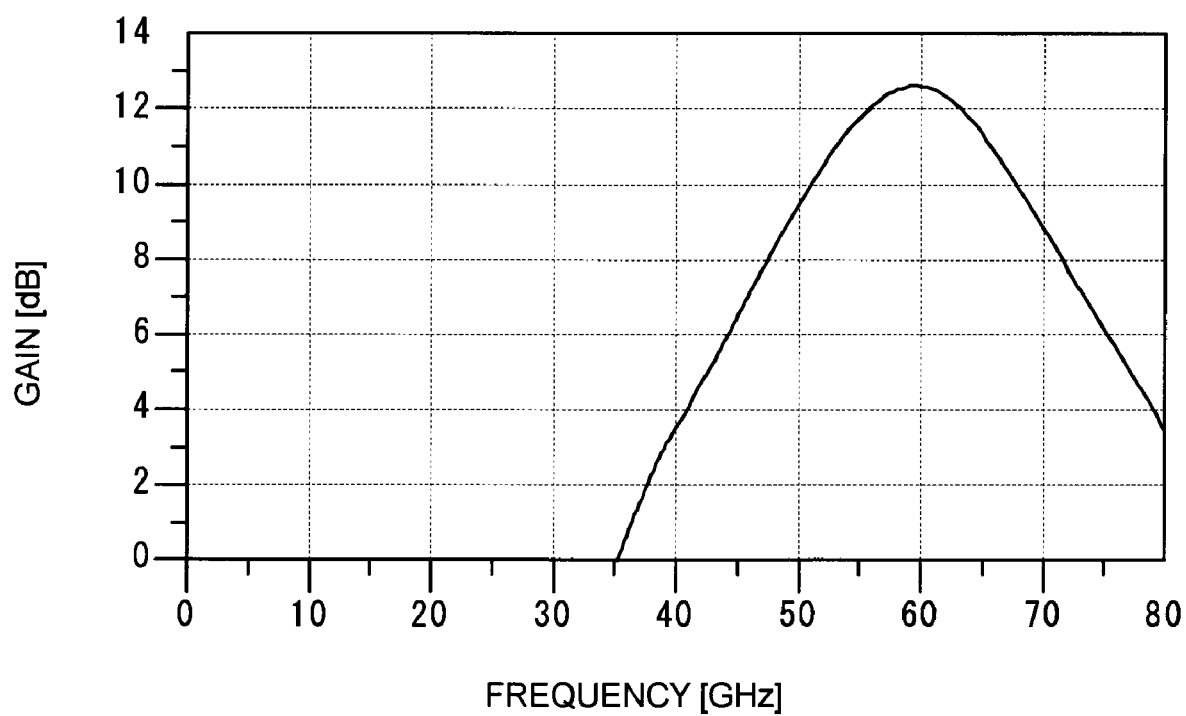
FIG. 4 illustrates a gain of the amplifier circuit of the first comparative example with regard to the frequency.

FIG. 4 illustrates results of a simulation in which the gain of the amplifier circuit 101 of the first comparative example with regard to the frequency is simulated. As illustrated in FIG. 4, the gain is the highest at about 60 GHz and decreases abruptly as the frequency becomes away from 60 GHz. It can be said that the band width having an effective gain is narrow in the first comparative example.

Figure 5:
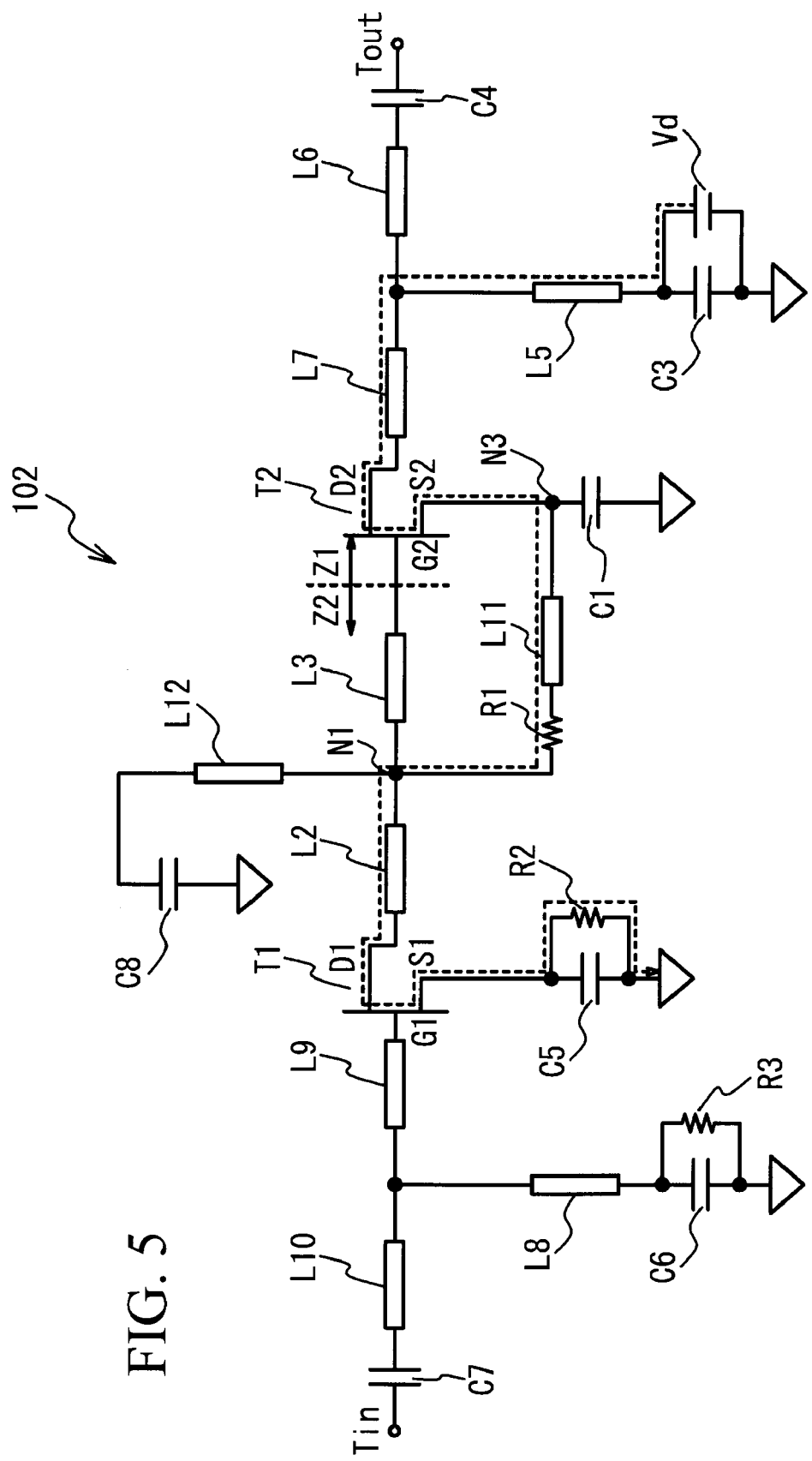
FIG. 5 is a circuit diagram of an amplifier circuit in accordance with a second comparative example.

FIG. 5 is a circuit diagram of an amplifier circuit 102 in accordance with a second comparative example. Referring to FIG. 5, the node N1 is grounded via a distributed constant line L12, which is a short stub, and the capacitor C8 connected in series. Other structures of the second comparative example are the same as those of the first comparative example in FIG. 1, and a description thereof is omitted here. According to the second comparative example, the node N1 is grounded via the distributed constant circuit L12 and the capacitor C8 connected in series, so that the amplifier circuit can have a wider band. However, since the distributed constant line L12 is added, the amplifier circuit has a larger size. Now, a description will be given of embodiments having a wider band and a smaller size.

First Embodiment

Figure 6:
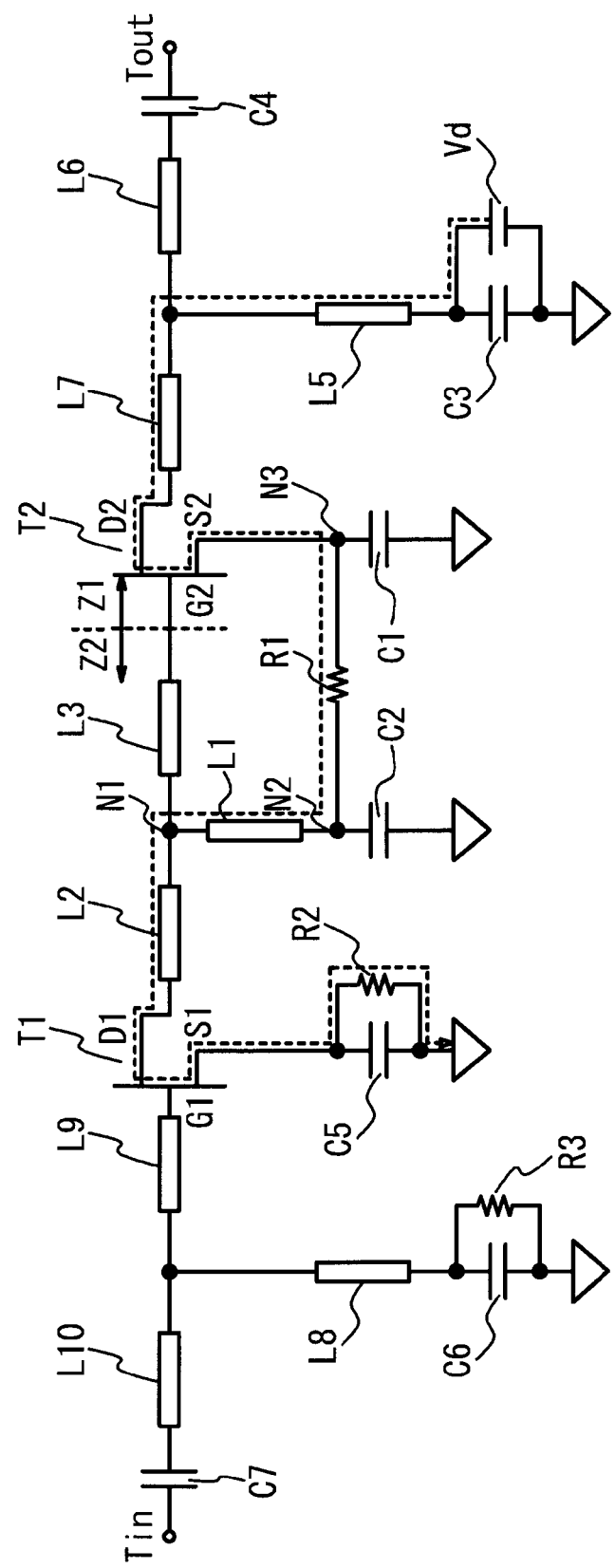
FIG. 6 is a circuit diagram of an amplifier circuit in accordance with a first embodiment.

FIG. 6 is a circuit diagram of an amplifier circuit 100 in accordance with a first embodiment. Referring to FIG. 6, one end of the first distributed constant line L1, which is a short stub, is connected to the first node N1, and the other end thereof is grounded via the second capacitor C2. The resistor R1 is connected between a second node N2 interposed between the first distributed constant line L1 and the second capacitor C2 and the third node N3 interposed between the source S2 of the second transistor and the first capacitor C1. With this arrangement, the third node N3 and the drain D1 of the first transistor T1 are connected together via the first distributed constant line L1 and the resistor R1 in DC circuit operations. The other structures of the first embodiment are similar to those of the first comparative example in FIG. 1, and a description thereof is omitted here.

Figure 7:
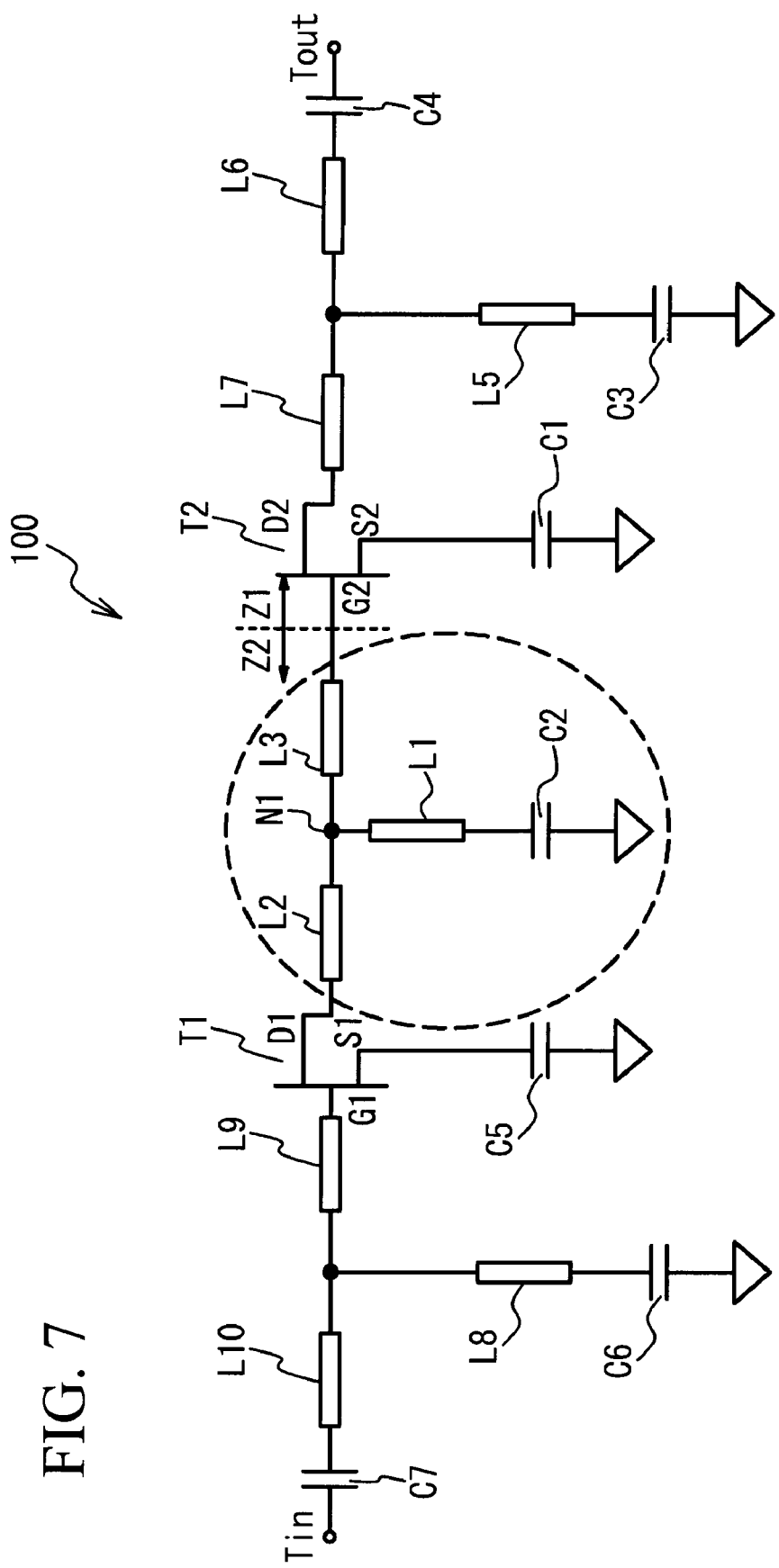
FIG. 7 is an equivalent circuit diagram of the amplifier circuit of the first embodiment in RF circuit operations.

FIG. 7 is an equivalent circuit diagram of the amplifier circuit of the first embodiment in RF circuit operations. Referring to FIG. 7, the length of the first distributed constant length L1 is not equal to $\lambda/4$, and the second impedance Z2 is adjusted by the distributed constant lines L1, L3 and L2 and the capacitor C2 (see a circle of broken line in FIG. 7).

A simulation of the amplifier circuit 100 of the second embodiment is as follows. Table 2 shows parameter values used in the simulation.

TABLE 2

| Line | L1 | L2 | L3 | L5 | L6 | L7 | L8 | L9 | L10 |
|---|---|---|---|---|---|---|---|---|---|
| μm | 220 | 165 | 115 | 185 | 155 | 185 | 130 | 70 | 100 |
| Capacitor | C1 | C2 | C3 | C4 | C5 | C6 | C7 | | |
| pF | 1.5 | 1.5 | 2.8 | 1.1 | 1.5 | 2.0 | 2.3 | | |
| Resistor | | R1 | | R2 | | R3 | | | |
| Ω | | 25 | | 25 | | 50 | | | |
| Power supply | | | | Vd | | | | | |
| V | | | | 5.0 | | | | | |

Figure 8:
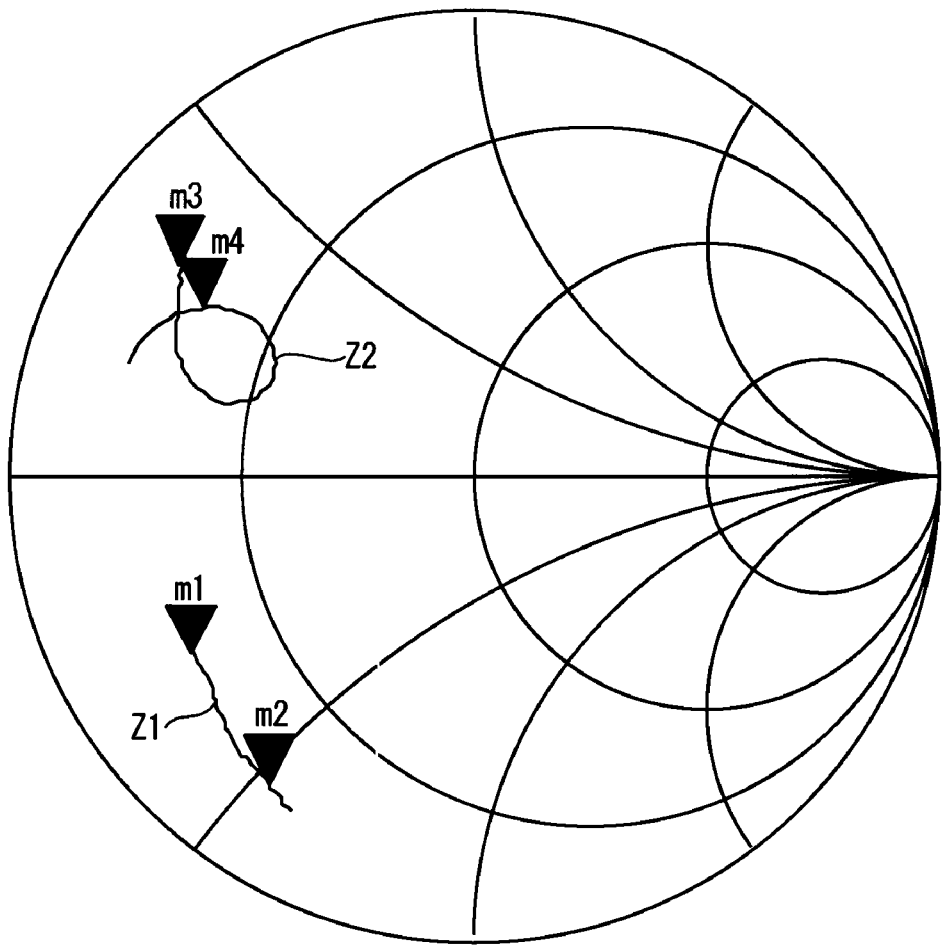
FIG. 8 illustrates results of a simulation of impedances Z1 and Z2 in the first embodiment.

FIG. 8 is a Smith chart in which the first impedance Z1 and the second impedance Z2 in the first embodiment are simulated. In FIG. 8, the second impedance Z2 is adjusted by using the distributed constant lines L1, L2 and L3 and the capacitor C2. The frequency used in the simulation ranges 45 GHz to 80 GHz. Inverted triangles m1 and m2 indicate the values of the first impedance Z1 obtained at 77 GHz and 50 GHz, respectively. Inverted triangles m3 and m4 indicate the values of the second impedance Z2 obtained at 77 GHz and 50 GHz, respectively. By rotating the second impedance Z2 so as to have a reduced radius, the first impedance Z1 and the second impedance Z2 are approximately complex conjugates over a wider band. Thus, impedance matching is established over the wider band.

Figure 9:
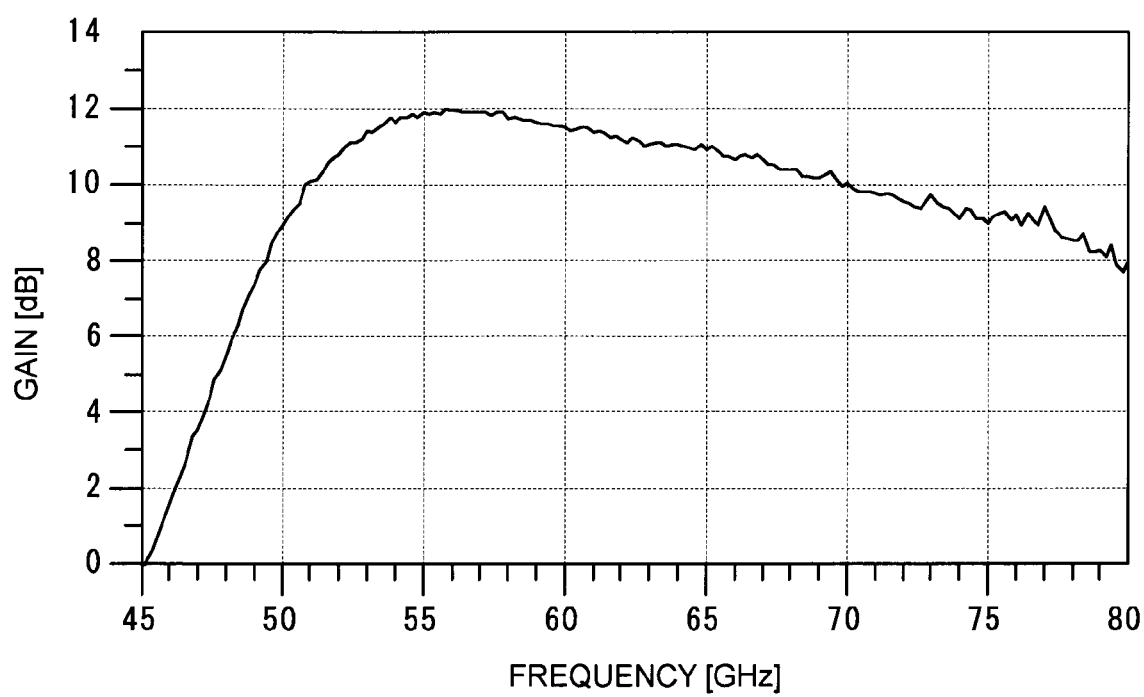
FIG. 9 illustrates results of a simulation of the gain of the amplifier circuit illustrated in FIG. 8 with regard to the frequency.

FIG. 9 illustrates results of a simulation in which the gain of the amplifier circuit 100 in FIG. 8 with regard to the frequency is simulated. Since the impedance matching between the first impedance z1 and the second impedance Z2 are substantially established, the loss of reflection of the RF signal from the first transistor T1 to the second transistor T2 is small over the wide band. However, the gain of the transistors becomes smaller as the frequency becomes higher. Thus, as illustrated in FIG. 8, the gain becomes the highest at a frequency of 55 GHz, and becomes smaller as the frequency becomes higher.

Figure 10:
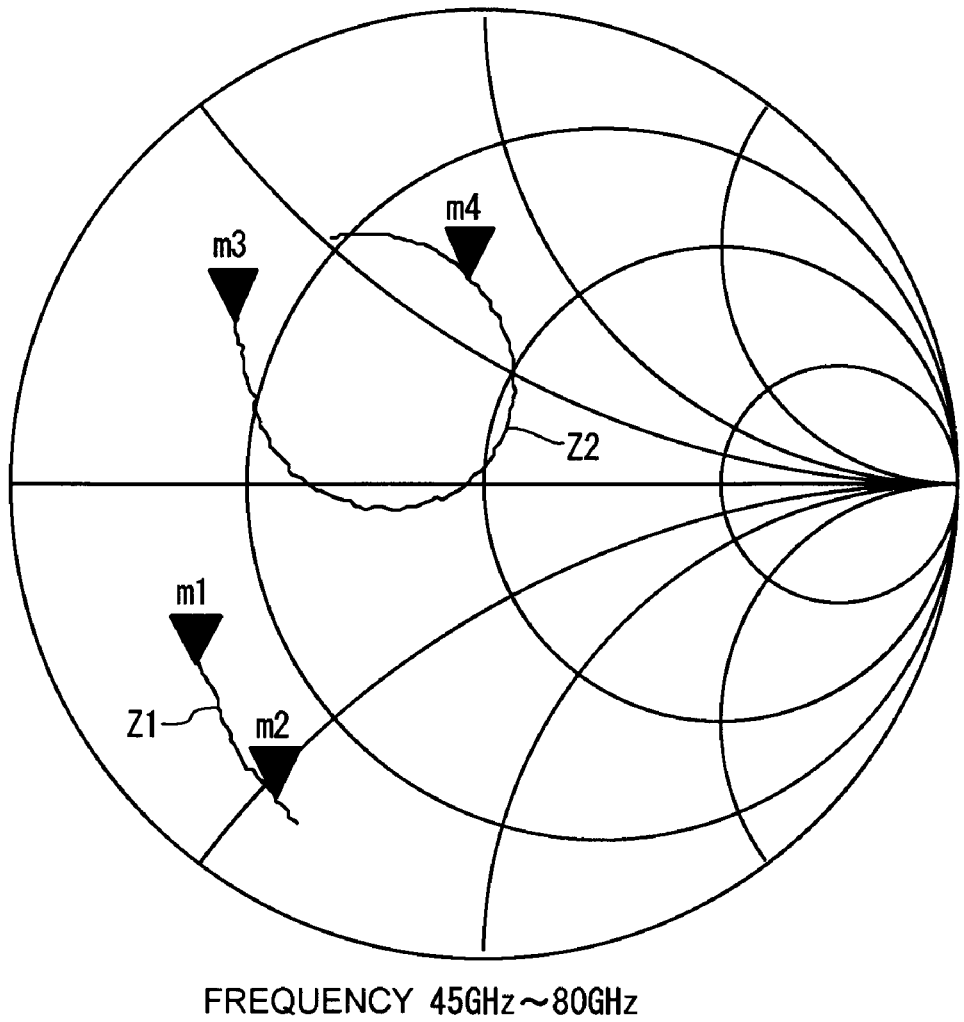
FIG. 10 illustrates results of another simulation of impedances Z1 and Z2 in the first embodiment.

FIG. 10 illustrates results of another simulation in which the first impedance Z1 and the second impedance Z2 in the first embodiment are simulated. Inverted triangles m1 and m2 indicate the values of the first impedance Z1 at 77 GHz and 50 GHz, respectively. Inverted triangles m3 and m4 indicate the values of the second impedance Z2 at 77 GHz and 50 GHz. The first impedance Z1 and the second impedance Z2 are adjusted so as to be approximately complex conjugates at a frequency of about 77 GHz. As the frequency becomes lower from 77 GHz, the first impedance Z1 and the second impedance Z2 are adjusted so as to deviate from the complex conjugates more greatly. The S parameters are obtained as illustrated in FIG. 10 by adjusting the second capacitor C2, the first distributed constant line L1, the second distributed constant line L2 and the third distributed constant line L3 in FIG. 7 so as to increase the bandwidth of the circuit of the first embodiment.

Figure 11:
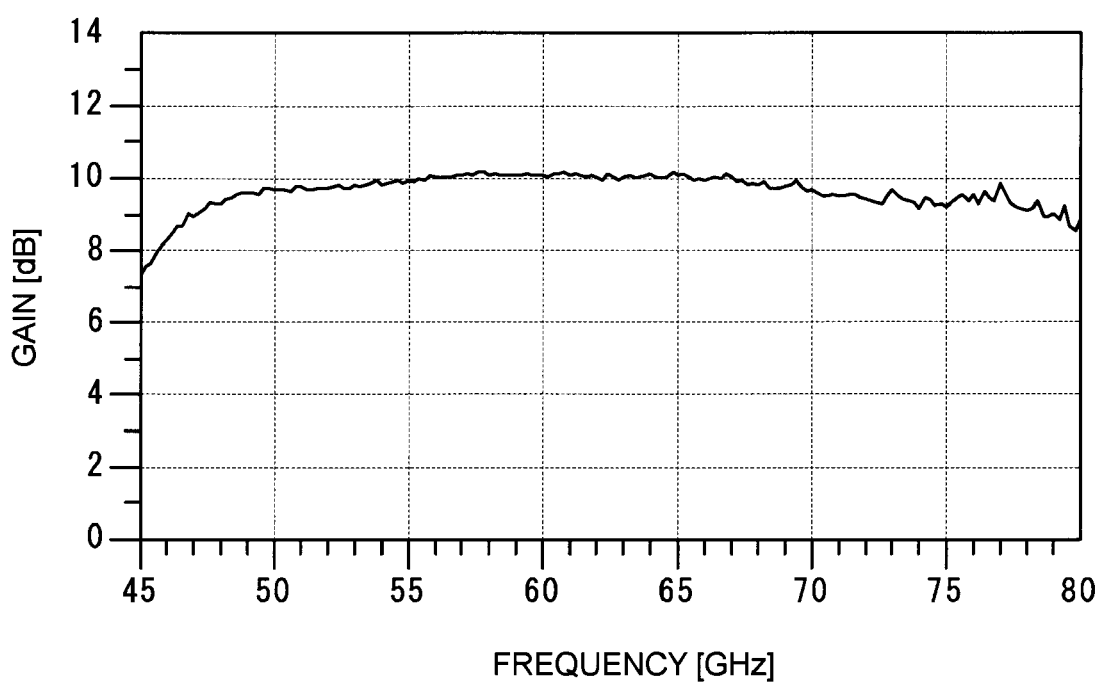
FIG. 11 illustrates results of a simulation of the gain of the amplifier circuit illustrated in FIG. 10 with regard to the frequency.

FIG. 11 illustrates results of a simulation in which the gain of the amplifier circuit 100 in FIG. 10 with regard to the frequency is simulated. Since impedance matching between the first impedance Z1 and the second impedance Z2 is substantially established at about 77 GHz, the loss of reflection of the RF signal from the first transistor T1 to the second transistor T2 is the smallest at about 77 GHz. As the frequency becomes lower, the impedance matching between the first impedance Z1 and the second impedance Z2 deviates from the matched state more greatly. Thus, the loss of reflection of the RF signal from the first transistor T1 to the second transistor T2 increases gradually. An increase in the loss of reflection is used to compensate for the increase in the gain of the transistor. It is thus possible to realize the wideband amplifier circuit having the gain that is constant over the wide band.

According to FIGS. 10 and 11, the first impedance Z1 and the second impedance Z2 are matched at maximum at a first frequency (for example, 77 GHz), and the impedances of the first distributed constant line L1, the second distributed constant line L2, the third distributed constant line L3, and the second capacitor C2 are adjusted so that the matching deviates from the matched state more greatly as the frequency becomes lower from the first frequency. It is thus possible to level the gain over the wide band. Further, the deviation of matching is handled by adjusting the impedances of the first distributed line L1, the second distributed line L2, the third distributed line L3 and the second capacitor C3 so as to compensate for the gains of the first transistor T1 and the second transistor T2 that become higher as the frequency becomes lower from the first frequency. It is thus possible to level the gain over the wide band.

According to the first embodiment, the number of distributed constant lines such as short stubs can be reduced, as compared to the second comparative example illustrated in FIG. 5, and downsizing of the amplifier circuit can be realized.

Second Embodiment

Figure 12A:
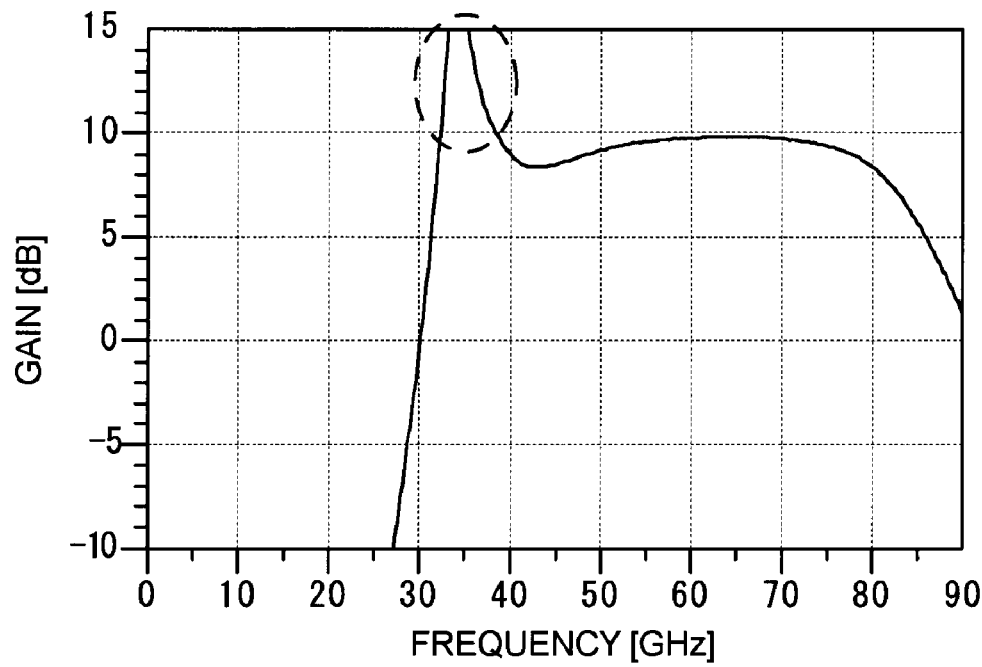
FIGS. 12A and 12B illustrate results of simulations of the gain and the stability factor K with regard to the frequency in a case where the impedances Z1 and Z2 are matched in a low frequency band in the first embodiment.
Figure 12B:
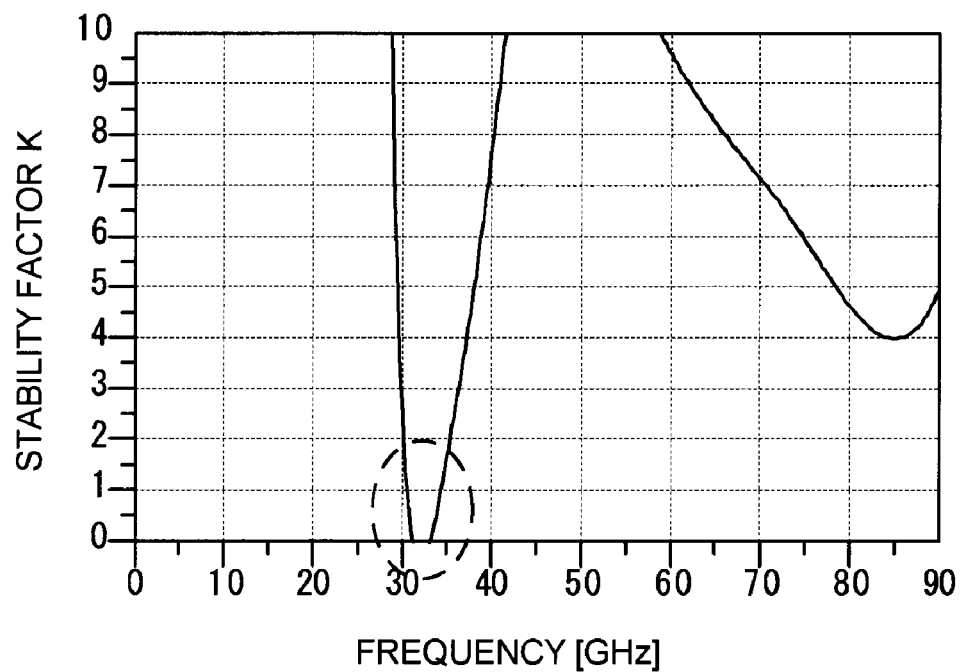

A second embodiment is an exemplary amplifier circuit capable of suppressing oscillation in a low frequency band. The amplifier circuit of the second embodiment has the same circuit configuration as that of the first embodiment illustrated in FIG. 6, and a description thereof is omitted here. As illustrated in FIG. 10 in connection with the first embodiment, when the second impedance Z2 is adjusted, the second impedance Z2 forms a large circular shape on the Smith chart. Thus, the first impedance Z1 and the second impedance Z2 may be matched again at a frequency close to the lower end of the band of the amplifier circuit 100. The second impedance Z2 in FIG. 10 is close to the first impedance Z1 at frequencies equal to or lower than 50 GHz. In this case, the impedance matching should be established at about 35 GHz and the gain should be high. However, the input impedance of the first transistor T1 and the output impedance of the second transistor T2 do not match an external impedance of 50Ω. This impedance mismatch causes the signal to have a gain between the first transistor T1 and the second transistor T2. Thus, the signal is repeatedly reflected, and finally, oscillates. FIGS. 12A and 12B illustrate results of a simulation of the gain and the stability factor K with regard to the frequency in a case where the first impedance Z1 and the second impedance Z2 are matched in a low frequency band in the first embodiment. As illustrated by a circle of broken line in FIG. 12A, the gain increases abruptly at about 35 GHz. As illustrated by a circle of broken line in FIG. 12B, the stability factor K is negative at about 35 GHz. Thus, the amplifier circuit 100 is unstable at frequencies close to the lower end of the band, and oscillates.

The impedance of the second capacitor C2 at frequencies close to the lower end of the band is set equal to or greater than the impedance of the resistor R1. This setting causes the signals of the above frequencies to be grounded via the capacitor C2 and pass through the resistor R1. Thus, the signals are attenuated by the resistor R1 and the oscillation can be suppressed.

Table 3 shows a value of the second capacitor C2 used in a simulation in which the second capacitor C2 is changed to 0.28 pF from 1.5 pF shown in Table 2. The other values used in the simulation are the same as those shown in Table 2.

TABLE 3

| Capacitor | C2 |
|---|---|
| pF | 0.28 |

Figure 13A:
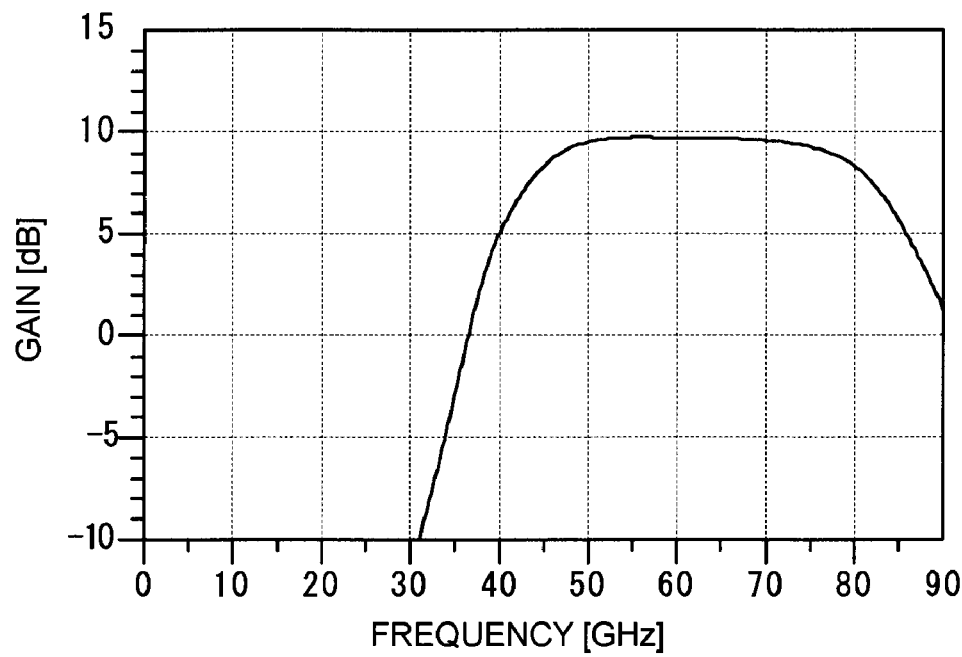
FIGS. 13A and 13B illustrate results of simulations of the gain and the stability factor K with regard to the frequency in a second embodiment.
Figure 13B:
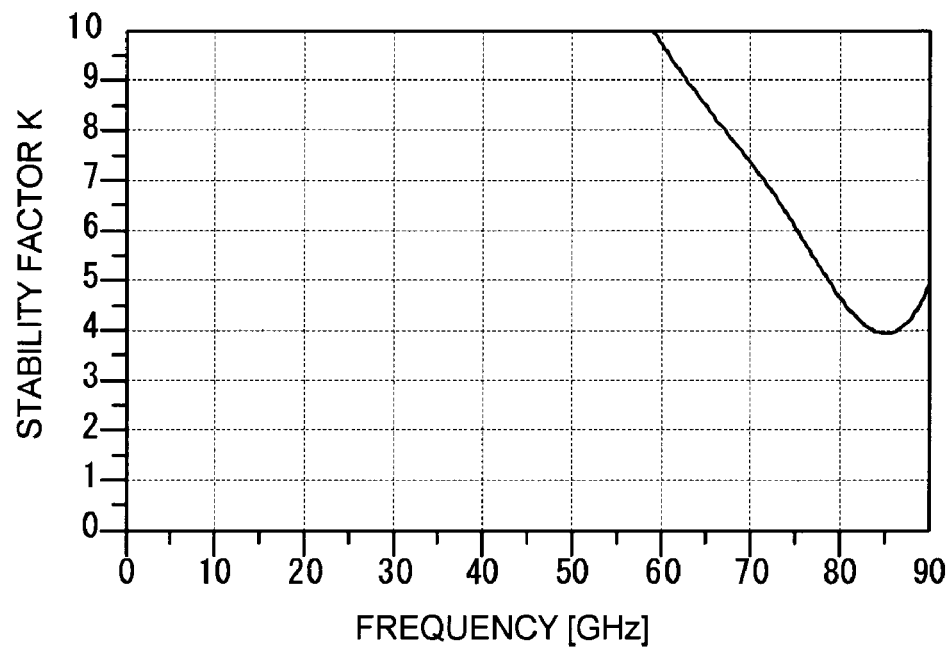

FIGS. 13A and 13B illustrate results of a simulation of the gain and the stability factor K with regard to the frequency in the second embodiment. As illustrated in FIG. 13A, the gain is stabilized even in the vicinity of the lower end of the band. As illustrated in FIG. 13B, the stability factor K is increased.

According to the second embodiment, the capacitance of the second capacitor C2 is adjusted so that the impedance of the second capacitor C2 is equal to or greater than the impedance of the resistor R1 at the frequency (second frequency) of the lower end of the band of the amplifier circuit 100. It is thus possible to suppress the oscillation as illustrated in FIGS. 12A and 12B. Further, the second capacitor C2 can be downsized. Further, it is possible to use, as an element for suppressing the oscillation, the resistor R1 that is provided in the path of DC current and develops the voltage difference between the source S2 of the second transistor T2 and the gate G2 thereof. Thus, the amplifier circuit can be downsized.

Third Embodiment

Figure 14:
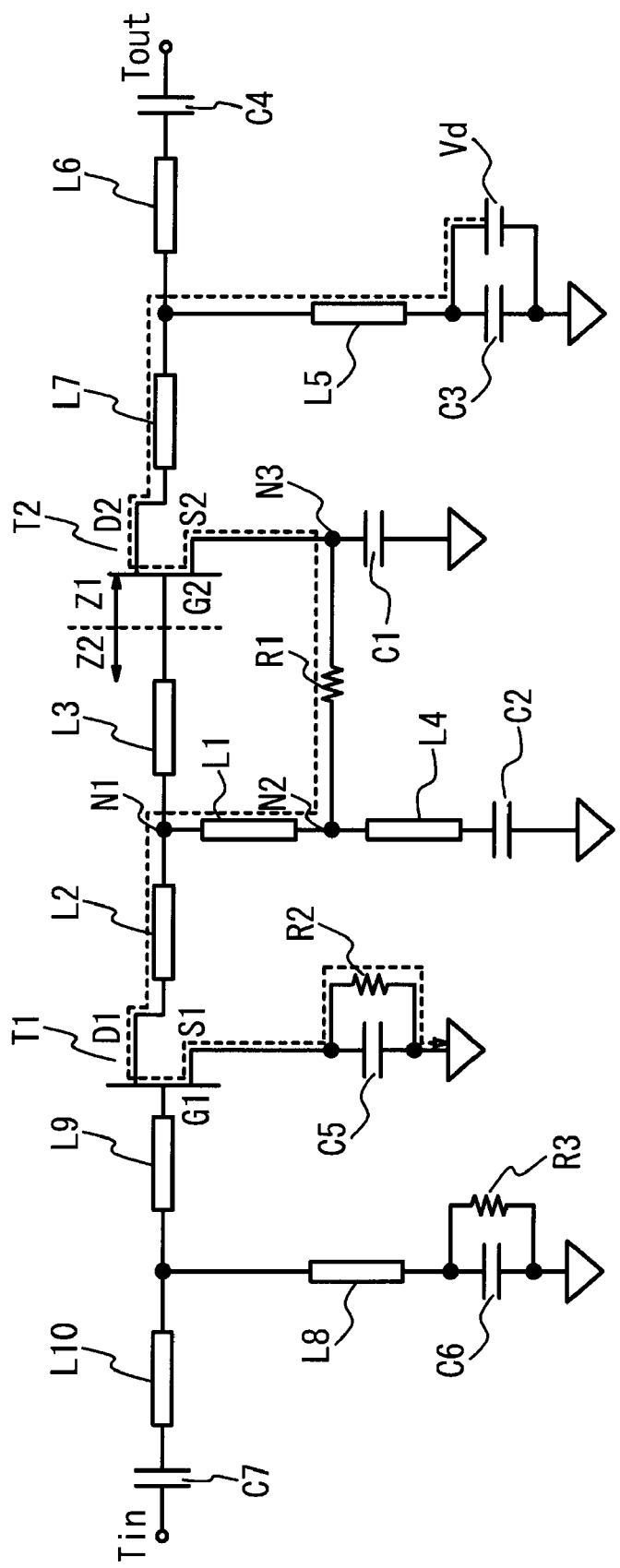
FIG. 14 is a circuit diagram of an amplifier circuit in accordance with a third embodiment.

FIG. 14 is a circuit diagram of an amplifier circuit in accordance with a third embodiment. FIG. 14 differs from FIG. 6 that illustrates the first embodiment in that one end of a fourth distributed constant line L4 is connected to the second capacitor C2 and the other end thereof is connected to the second node N2. The fourth embodiment is capable of abruptly increasing the total impedance of the fourth distributed constant line L4 and the second capacitor C2 at the frequency of the lower end of the band of an amplifier circuit 100a. Thus, the signal is greatly attenuated by the resistor R1 at the frequency (for example, 40-50 GHz) of the lower end of the band in which oscillation should be suppressed. In the pass-band (for example, 50-80 GHz) the total impedance of the fourth distributed constant line L4 and the second capacitor C2 is reduced. It is no longer needed to consider the influence of the resistor R1 in the pass-band.

Table 4 shows the values of the distributed constant line L4 and the second capacitor C2 used in a simulation in which the length of the fourth distributed line L4 is changed to 105 μm and the second capacitor C2 is changed to 0.17 pF from the values shown in Table 2. The other values used in the simulation are the same as those shown in Table 2.

TABLE 4

| Line | L4 |
|---|---|
| Mm | 105 |
| Capacitor | C2 |
| PF | 0.17 |

Figure 15A:
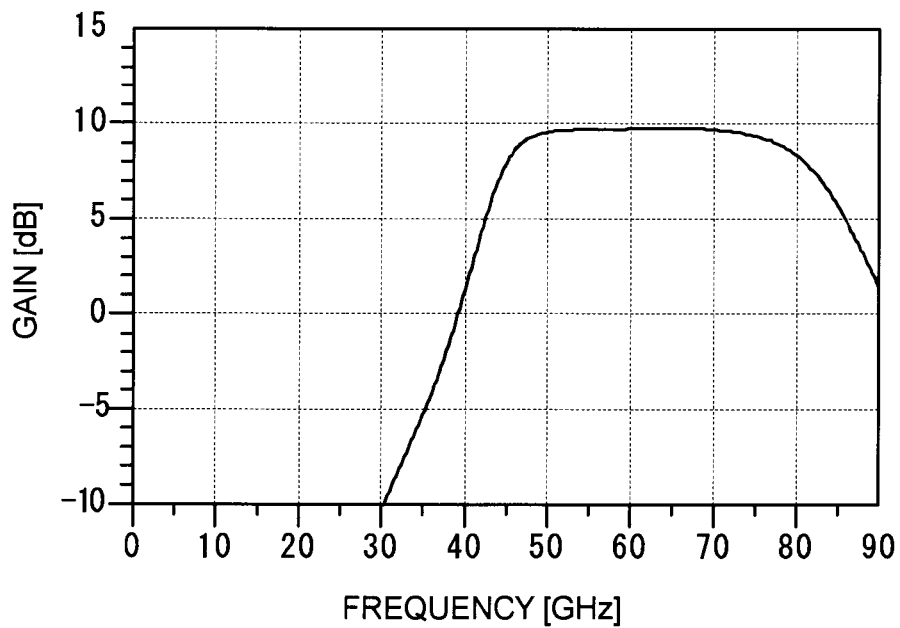
FIGS. 15A and 15B illustrate results of simulations of the gain and the stability factor K with regard to the frequency in the embodiment 3.
Figure 15B:
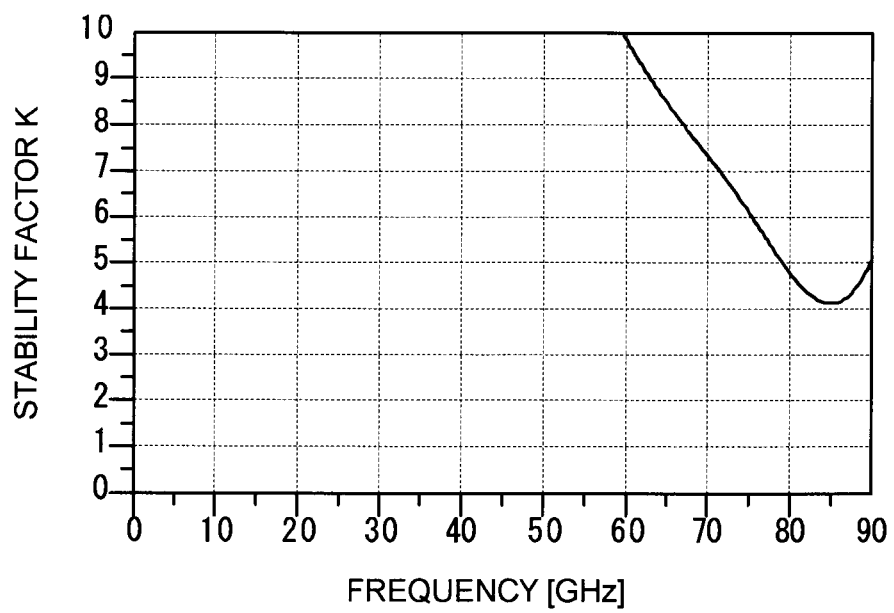

FIGS. 15A and 15B illustrate results of a simulation of the gain and the stability factor K with regard to the frequency in the third embodiment. As illustrated in FIG. 15A, the gain in the vicinity of the lower end of the band decreases abruptly, as compared to FIG. 13A. The third embodiment is capable of abruptly decreasing the gain in the vicinity of the lower end of the band. As illustrated in FIG. 15B, the stability factor K is increased.

According to the third embodiment, the total impedance of the second capacitor C2 and the fourth distributed constant line L4 is set equal to or greater than the impedance of the resistor R1 at the frequency (second frequency) of the lower end of the band of the amplifier circuit 100. It is thus possible to suppress the oscillation as illustrated in FIGS. 12A and 12B as in the case of the second embodiment. Further, the total impedance of the second capacitor C2 and the fourth distributed constant line L4 in the band of the amplifier circuit is set smaller than the impedance at the frequency of the lower end of the band. Thus, the signal is grounded via the second capacitor C2 and the fourth distributed line L4. It is thus possible to design the amplifier circuit without considering the influence of the resistor R1 in the above band.

Although FETs are used as the first and second transistors T1 and T2 in the first through third embodiments, bipolar transistors may be used. In this case, the emitter, collector and base of the bipolar transistor correspond to the first terminal, the second terminal and the control terminal. The distributed constant lines may be inductance elements such as short stubs.

The present invention is not limited to the specifically described embodiments, but various embodiments and variations may be made without departing from the scope of the present invention.

What is claimed is:

1. An electronic circuit comprising:
   a first transistor having a first terminal, a second terminal and a control terminal, the first terminal being grounded;
   a second transistor having a control terminal coupled with the second terminal of the first transistor, a first terminal grounded via a first capacitor, and a second terminal to which a DC power supply is connected;
   a first distributed constant line having one end connected to a first node between the second terminal of the first transistor and the control terminal of the second transistor and another end grounded via a second capacitor;
   a second distributed constant line having one end connected to the second terminal of the first transistor and another end connected to the first node;
   a third distributed constant line having one end connected to the control terminal of the second transistor and another end connected to the first node;
   a resistor connected between a second node interposed between the first distributed constant line and the second capacitor and a third node interposed between the first terminal of the second transistor and the first capacitor; and
   a path that connects the third node and the second terminal of the first transistor via the first distributed constant line and the resistor in a DC circuit operation.

2. The electronic circuit according to claim 1, wherein, assuming that an impedance obtained by viewing the second transistor from the control terminal of the second transistor is a first impedance and an impedance obtained by viewing a third distributed constant line from the control terminal of the second transistor, the first, second and third distributed constant lines and the second capacitor are adjusted so that matching between the first impedance and the second impedance is established at best at the first frequency and deviates from best matching more greatly as the frequency becomes lower from the first frequency.

3. The electronic circuit according to claim 2, wherein the first, second and third distribution constant lines and the second capacitor are adjusted so as to compensate for gains of the first and second transistors that become higher as the frequency becomes lower from the first frequency.

4. The electronic circuit according to claim 3, wherein the second capacitor has an impedance is equal to or greater than that of the resistor at a second frequency of a lower end of a band of the electronic circuit.

5. The electronic circuit according to claim 1, further comprising a fourth distributed constant having one end connected to the second capacitor and another end connected to the second node,
wherein a total impedance of the second capacitor and the fourth distributed constant line at a second frequency of a lower end of a band of the electronic circuit is equal to or greater than an impedance of the resistor.

6. The electronic circuit according to claim 5, wherein the total impedance of the second capacitor and the fourth distributed constant line in a band of the electronic circuit is smaller than an impedance at the second frequency.

7. The electronic circuit according to claim 1, wherein the first transistor and the second transistors are HEMTs.

8. The electronic circuit according to claim 1, wherein the first terminal of the first transistor is grounded via a parallel circuit of a resistor and a capacitor.

9. The electronic circuit according to claim 6, wherein a band of the electric circuit is 50 GHz to 80 GHz.

10. The electronic circuit according to claim 7, wherein a second frequency of a lower end of the band is 50 GHz.

* * * * *